United States Patent
Choi et al.

(10) Patent No.: US 7,981,799 B2
(45) Date of Patent: Jul. 19, 2011

(54) ROOM TEMPERATURE-OPERATING SINGLE-ELECTRON DEVICE AND THE FABRICATION METHOD THEREOF

(75) Inventors: Jung Bum Choi, Chungcheongbuk-do (KR); Chang Keun Lee, Seoul (KR); Min Sik Kim, Chungcheongbuk-do (KR)

(73) Assignee: Chungbuk National University Industry-Academic Cooperation Foundation (KR)

( * ) Notice: Subject to any disclaimer, the term of this patent is extended or adjusted under 35 U.S.C. 154(b) by 0 days.

(21) Appl. No.: 12/305,770

(22) PCT Filed: Sep. 11, 2008

(86) PCT No.: PCT/KR2008/005358
§ 371 (c)(1),
(2), (4) Date: Jan. 16, 2009

(87) PCT Pub. No.: WO2009/035268
PCT Pub. Date: Mar. 19, 2009

(65) Prior Publication Data
US 2010/0163843 A1    Jul. 1, 2010

(30) Foreign Application Priority Data

Sep. 14, 2007 (KR) .................. 10-2007-0093890
Aug. 27, 2008 (KR) .................. 10-2008-0083827

(51) Int. Cl.
*H01L 21/44* (2006.01)
(52) U.S. Cl. ... 438/682; 438/680; 438/712; 257/E21.17; 257/E21.32; 257/E21.218; 257/E21.278; 257/E21.347
(58) Field of Classification Search ............ 438/682, 438/199, 311, 700, 680, 712, 723, 743; 257/E21.006, 17, 32, 218, 227, 278, 347
See application file for complete search history.

(56) References Cited

U.S. PATENT DOCUMENTS

| | | |
|---|---|---|
| 7,268,407 B2 | 9/2007 | Jang et al. |
| 2010/0006921 A1* | 1/2010 | Makihara et al. ............. 257/321 |
| 2010/0155808 A1* | 6/2010 | Makihara et al. ............. 257/316 |

FOREIGN PATENT DOCUMENTS

| | | |
|---|---|---|
| JP | 2000-243936 A | 9/2000 |
| KR | 10-2003-0043513 A | 6/2003 |

* cited by examiner

*Primary Examiner* — David Nhu
(74) *Attorney, Agent, or Firm* — Akerman Senterfitt

(57) ABSTRACT

The present invention relates to a room temperature-operating single-electron device and a fabrication method thereof, and more particularly, to a room temperature-operating single-electron device in which a plurality of metal silicide dots formed serially is used as multiple quantum dots, and a fabrication method thereof.

17 Claims, 8 Drawing Sheets

ROOM TEMPERATURE-OPERATING SINGLE-ELECTRON DEVICE AND THE FABRICATION METHOD THEREOF

This application claims priority to Korean Patent Application No. 10-2007-0093890, filed Sep. 14, 2007 and Korean Patent Application No. 10-2008-0083827, filed Aug. 27, 2008, both of which are hereby incorporated by reference.

TECHNICAL FIELD

The present invention relates to a roan temperature-operating single-electron device and a fabrication method thereof, and more particularly, to a room temperature-operating single-electron device in which a plurality of metal silicide dots formed serially is used as multiple quantum dots, and a fabrication method thereof.

BACKGROUND ART

Single-electron devices have very low power consumption, and hence can relatively improve the degree of integration of circuits as compared to conventional devices. In particular, the single-electron devices have significantly special characteristics in that a drain current is increased or decreased periodically depending on a gate voltage.

More specifically, when induced charges are increased in a quantum dot due to an increase in the gate voltage and consequently the quantity of induced charges in the quantum dot reaches an elementary charge quantity, one electron tunnels from a source to the quantum dot to cause the quantity of induced charges to be cancelled so as to minimize a potential energy of the quantum dot. Like this, through the sweeping of the gate voltage, a phenomenon is repeated periodically that the quantity of induced charges of the continuous values in the quantum dot increased by the gate voltage are cancelled by the electron tunneling from the source to the quantum dot to minimize the potential energy of the quantum dot. This phenomenon is called a coulomb oscillation. That is, the coulomb oscillation is observed by the periodic on/off of the drain current according to a change in the gate voltage. In the coulomb oscillation, a coulomb blockade region and a tunneling region are regularly oscillated so that signals "1" and "0" are periodically generated for respective regions.

The single-electron device is a device that enables one electron is added to the electrode or is subtracted from the electrode by a coulomb blockade effect. The single-electron device has low power consumption and appears as the next-generation device to substitute for a complementary metal-oxide-semiconductor (CMOS) in terms of the degree of integration.

Currently, the operating temperature of the device is increased in such a fashion that the electric capacity is reduced through only a reduction in the size of a single quantum dot. But, if multiple quantum dots are formed by using metal dots, the electric capacity of the single-electron device itself can be decreased to raise the operating temperature of the device to the roan temperature. When the multiple quantum dots are arranged in series, the number of quantum dots having the same electric capacity is increased to decrease the entire electric capacity.

In general, the main use purpose of silicide is as follows. As a design rule of semi-conductor devices is more strictly applied, high sheet resistance of a gate is a main cause of degrading the operating speed of the device. Thus, in order to improve the operating speed of the device, it is indispensable to fabricate a gate electrode of low resistance. For the purpose of such improvement of resistance, a gate electrode was used which includes a refractory metal silicide having a low specific resistance.

Although not shown concretely, the aforementioned conventional single-electron device can be shown in the following two types. One type is that after formation of a channel, the quantum dots are formed by a thermal oxidation process depending on the shape of the channel. In order to fabricate a room temperature-operating device employing this scheme, a quite small quantum dot is required and it is not easy to control the electric capacity of a tunnel junction, which makes fabrication of the device difficult.

The other type is that a plurality of quantum dots is formed serially on a single substrate by means of electronic beam lithography and reactive ion etching (RIE) to reduce the entire electric capacity of the quantum dots. In order to fabricate the roan temperature-operating device employing this scheme, the size of a single quantum dot is made large, and hence the length of an active region is increased up to a range of a μm unit, which makes it difficult to improve the degree of integration of the single-electron device.

DISCLOSURE OF INVENTION

Technical Problem

Accordingly, the present invention has been made an effort to address and solve the above-mentioned problems occurring in the prior art, and it is an object of the present invention to provide a roan temperature-operating single-electron device in which a metal film is deposited between a source and a drain and a plurality of metal silicide dots is formed on the metal film so as to be used as quantum dots to thereby enable to configure a plurality of quantum dots having a very small electric capacity, and thus to improve the operational functionability of the device at roan temperature and achieve low power consumption and high degree of integration of the device, and a fabrication method thereof.

Technical Solution

To accomplish the above object, according to the present invention, a method of fabricating a room temperature-operating single-electron device includes:

a first step of forming an SOI substrate by sequentially stacking an insulating layer 11 and a silicon layer 10 on a silicon substrate 12, and etching the silicon layer 10 of the SOI substrate to thereby form an active region 10a;

a second step of forming a mask 20 on a central channel portion of the active region 10a, and injecting impurity ions into a part of the active region 10a to form a source region and a drain region;

a third step of forming a silicon oxide film 30 on the entire top surface of the SOI substrate;

a fourth step of etching the channel portion of the active region 10a to form a silicide trench 31;

a fifth step of depositing an oxide film 40 on the entire top surface of the SOI substrate;

a sixth step of depositing a metal film 42 on the entire top surface of the oxide film;

a seventh step of thermally treating a part of the metal film 42 to achieve silicidization of the metal dots, and removing the silicon oxide film 30 and the metal film 42 which is not silicidized to form serially-arrayed silicide quantum dots 41;

an eighth step of depositing gate oxide films 50a and 50b on the entire top surface of the SOI substrate;

a ninth step of etching a part of the gate oxide films 50a and 50b positioned on the top of a source 13 and a drain 14 formed on both ends of the active region 10a to form each contact hole, and depositing a metal film to fill the contact hole to form a source pad 60 and a drain pad 61; and a tenth step of forming a resist pattern on the silicide trench 31 to form a gate.

Also, according to the present embodiment, the active region 10a may have a length of 1 to 100 nm and a width of 10 to 15 nm.

In addition, according to the present embodiment, the active region 10a may be formed by means of photolithography, electronic beam lithography or reactive ion etching.

Moreover, according to the present embodiment, the silicon oxide film 30 may have a thickness of 2 to 10 nm.

Also, according to the present embodiment, in the third step, the silicon layer 10 may have a thickness of 40 to 45 nm and a width of 6 to 10 nm.

In addition, according to the present embodiment, in the fourth step, the channel portion of the active region 10a may be etched by means of reactive ion etching to have a thickness of 2 to 10 nm.

Moreover, according to the present embodiment, in the fifth step, the oxide film 40 may be formed in such a fashion as to be left to stand in a hydrogen peroxide solution ($H_2O_2$) or in the air.

Also, according to the present embodiment, in the sixth step, the metal film 42 may be made of cobalt.

In addition, according to the present embodiment, in the sixth step, the meal film 42 may be deposited by means of electronic beam evaporator or molecular beam epitaxy (MBE) equipment in such a fashion that its thickness is within a range from 0.1 to 1 nm.

Moreover, according to the present embodiment, in the seventh step, the metal film 42 may be thermally treated through an electronic beam lithography process to form the silicide quantum dots 41.

Also, according to the present embodiment, the silicon oxide film 30 may be removed by using a buffered oxide etchant (BOE) and the non-silicidized metal film 42 is removed by using a mixed solution of sulfuric acid and hydrogen peroxide solution.

In addition, according to the present embodiment, each of the silicide quantum dots 41 has a diameter of 2 to 10 nm and the number of the silicide quantum dots is 1 to 50.

Moreover, according to the present embodiment, in the eighth step, the gate oxide film is formed to a thickness of 30 to 50 nm by a chemical vapor deposition (CVD).

Also, according to the present embodiment, in the eighth step, the gate oxide film has a thickness of 100 to 300 nm, and the gate oxide film on the silicide trench 31 is formed to a thickness of 30 to 50 nm by a chemical vapor deposition (CVD).

In addition, according to the present embodiment, the gate may be a control gate 62 or a T-shaped gate 63.

Also, the gate may have a thickness of 100 to 500 nm. Also, the object of the present invention can be achieved by a fabrication method of a roan temperature-operating single-electron device, the method comprising:

a first step of forming an SOI substrate by sequentially stacking an insulating layer 11 and a silicon layer 10 on a silicon substrate 12, and etching the silicon layer 10 of the SOI substrate to thereby form an active region 10a;

a second step of forming a mask 20 on a central channel portion of the active region 10a, and injecting impurity ions into the active region 10a to form a source region and a drain region;

a third step of forming a silicon oxide film 30 on the entire top surface of the SOT substrate;

a fourth step of etching the channel portion of the active region 10a by using the silicon oxide film 30 of the channel portion as a mask to form a silicide trench 31;

a fifth step of depositing a metal film 42 on the entire top surface of the SOI substrate and subjecting the metal film to silicidization;

a sixth step of removing the silicon oxide film 30 and the metal film 42 which is not silicidized to form serially-arrayed silicide quantum dots 41;

a seventh step of forming a protective film 70 on the entire top surface of the SOT substrate;

an eighth step of etching the protective film 70 positioned on the top of a source and a drain formed on both ends of the active region 10a to form each contact hole, and depositing a metal film to fill the contact hole to form a source pad 60 and a drain pad 61; and a ninth step of depositing a metal film on the underside of the SOI substrate to form a bottom gate.

In addition, the above object of the present invention can be achieved by a roan temperature-operating single-electron device fabricated by the fabrication method as described above.

Advantageous Effects

Accordingly, the according to the present invention has an advantageous effect in that since a plurality of metal silicide dots is formed serially as multiple quantum dots between a source and a drain to thereby reduce the entire electric capacity of the singe-electron device, the operational efficiency of the device can be enhanced.

In particular, a 'T'-shaped gate is formed on a top of a channel so as to control a potential energy in only a quantum dot region, so that any electrical interference between the source and drain regions can be prevented from occurring to enable the single-electron device to be operated even at room temperature.

In addition, in information of the metal silicide dots using cobalt, metal silicide quantum dots having a uniform size and density distribution are formed by using a metal film formed with an oxide film is employed, thereby implementing more stable quantum dots.

BEST MODE FOR CARRYING OUT THE INVENTION

Reference will now be made in detail to the preferred embodiment of fabrication method of a room temperature-operating single-electron device according to the present invention with reference to the attached drawings.

First Embodiment

FIGS. 1 to 18 show the exemplary states in the fabrication method of a room temperature-operating single-electron device according to the present invention.

Figure 1:
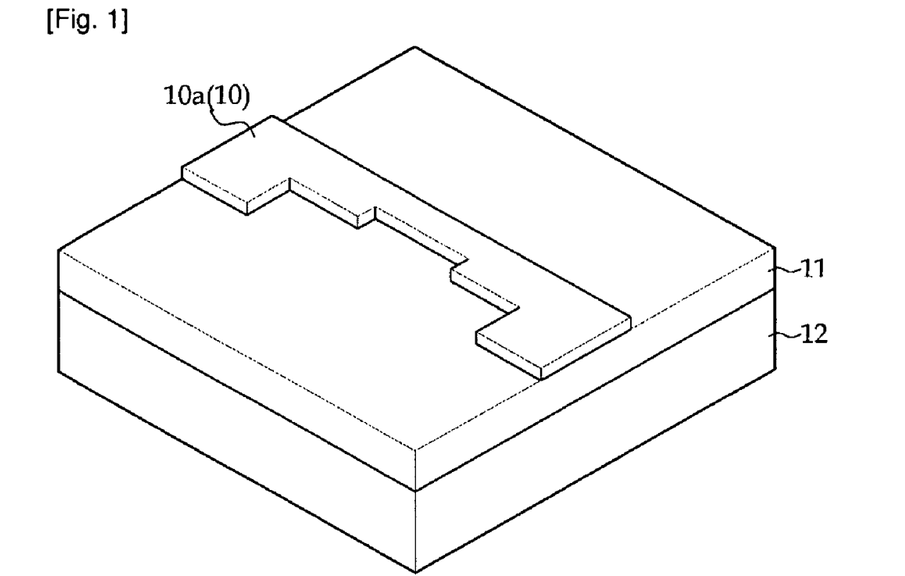
FIG. 1 is a perspective view illustrating a state where an active region is formed in a fabrication method of a room temperature-operating single-electron device according to a first embodiment of the present invention.

A first step is a step where a active region 10a is formed on an SOI substrate. In this case, the active region 10a includes a source 13 and a drain 14 which will be described later, and a channel ix interconnecting the source and the drain. The SOI substrate is formed in such a fashion that an insulating layer 11 and a silicon layer 10 are sequentially stacked on a silicon substrate 12. The active region 10a is formed by etching the silicon layer 10 of the SOI substrate.

The thickness of the silicon layer 10 is made to have approximately 50 nm, and the etching of the silicon layer 10 for forming the active region 10a employs photolithography, electronic beam lithography or reactive ion etching. As shown in FIG. 1, the active region 10a formed by the etching of the silicon layer 10 preferably has a length of approximately 1 to 100 nm and a width of approximately 10 to 15 nm.

Figure 2:
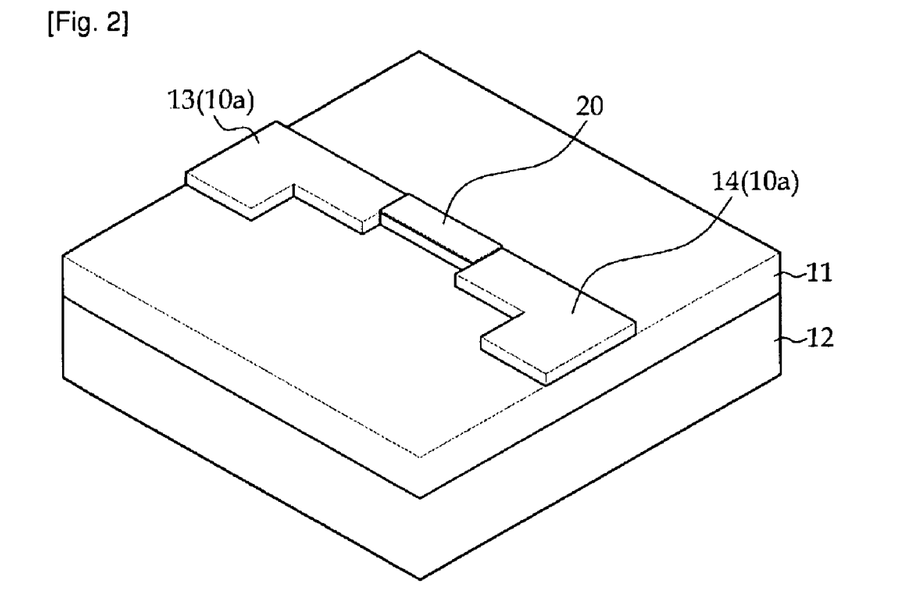
FIG. 2 is a perspective view illustrating a state where a mask is firmed in a fabrication method of a room temperature-operating single-electron device according to a first embodiment of the present invention.

A second step is a step where impurities are injected into a part of the active region 10a to form a source region and a drain region. For the purpose of injection of the impurities, a mask 20 is firmed on a top of the active region 10a, preferably, as shown in FIG. 2, on a central channel portion and impurity ions are injected into both sides of the channel portion to form a source 13 and a drain 14. At this time, the mask 20 preferably employs a photoresist pattern for a doping masking. After the injection of the impurities has been completed, the mask 20 is removed. Since a method of removing the mask 20 is well-known apparently within the scope of those skilled in the art, the detailed description thereof will be omitted.

Figure 3:
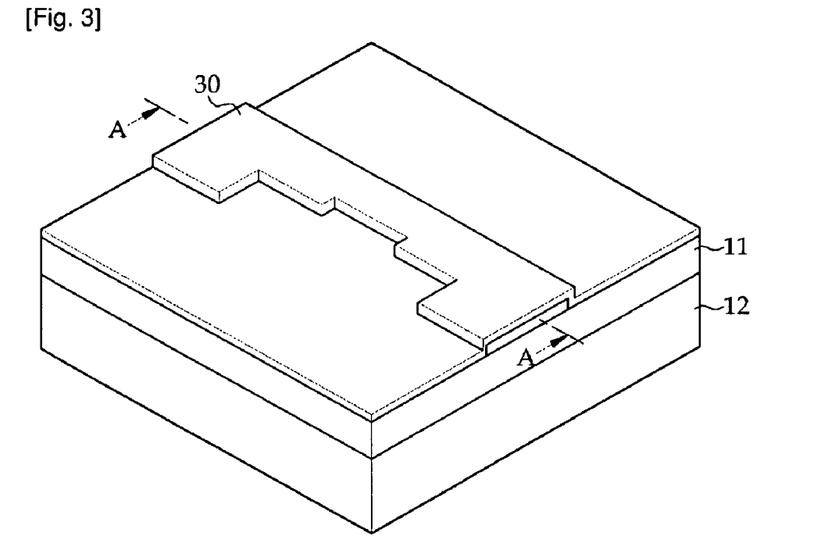
FIG. 3 is a perspective view illustrating a state where a silicon oxide film is formed in a fabrication method of a room temperature-operating single-electron device according to a first embodiment of the present invention.
Figure 4:
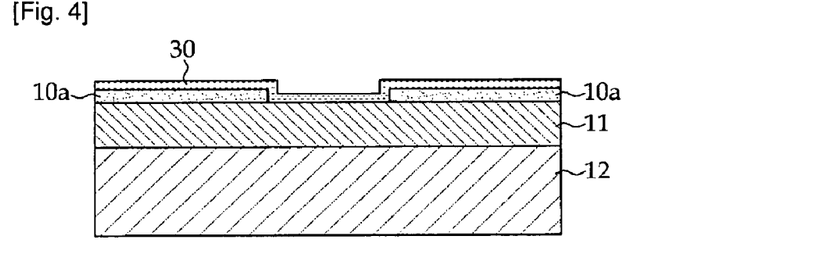
FIG. 4 is a cross-sectional view taken along the line A-A of FIG. 3.

A third step is a step where a silicon oxide film 30 is formed. As shown in FIGS. 3 and 4, the silicon oxide film 30 is firmed to a thickness of approximately 2 to 10 nm on the silicon layer 10 of the SOI substrate. The silicon oxide film 30 may be formed by using a thermal oxidation process. By taking into consideration that the thickness of the silicon layer 10 is decreased along with formation of the silicon oxide film 30, the silicon oxide film 30 is formed such that the silicon layer 10 has a thickness of 40 to 45 nm a width of 6 to 10 nm. The thermal oxidation process used to form the silicon oxide film 30 is also aimed to thermally treat the impurity ions injected into the channel portion of the active region 10a.

Figure 5:
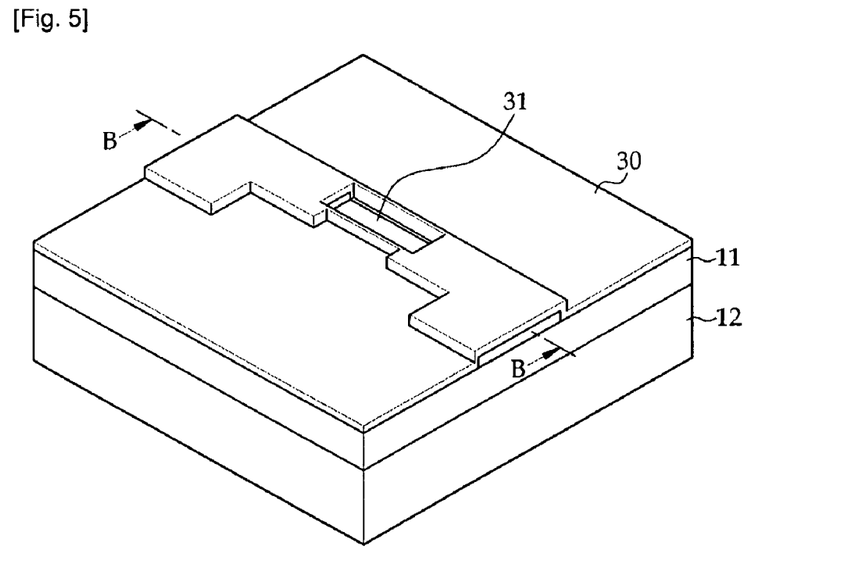
FIG. 5 is a perspective view illustrating a state where a silicide trench is formed in a fabrication method of a room temperature-operating single-electron device according to a first embodiment of the present invention.
Figure 6:
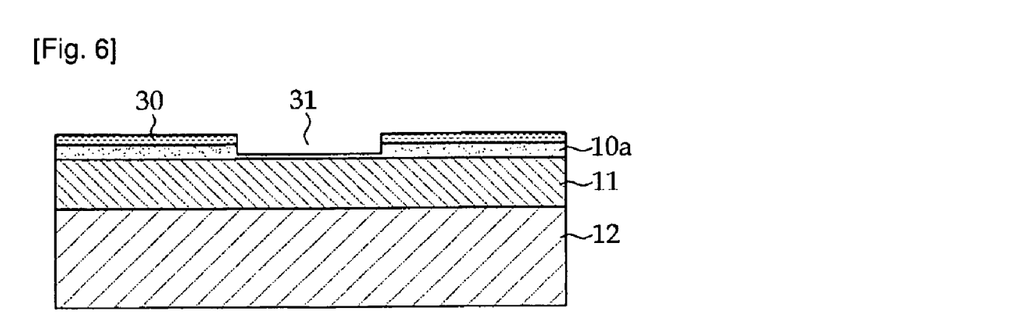
FIG. 6 is a cross-sectional view taken along the line B-B of FIG. 5.

A fourth step is a step where a silicide trench 31 is formed. First, prior to formation of the silicide trench 31, the silicon oxide film 30 formed on the channel portion of the active region 10a is etched. Subsequently, when the silicon layer 10 of the channel portion is etched by using the remaining silicon oxide film 30 as a mask, the silicide trench 31 is formed as shown in FIGS. 5 and 6. The silicon layer 10 of the channel portion is etched by means of reactive ion etching to have a thickness of 2 to 10 nm. The silicide trench 31 is a region where metal silicide quantum dots will be formed.

Figure 7:
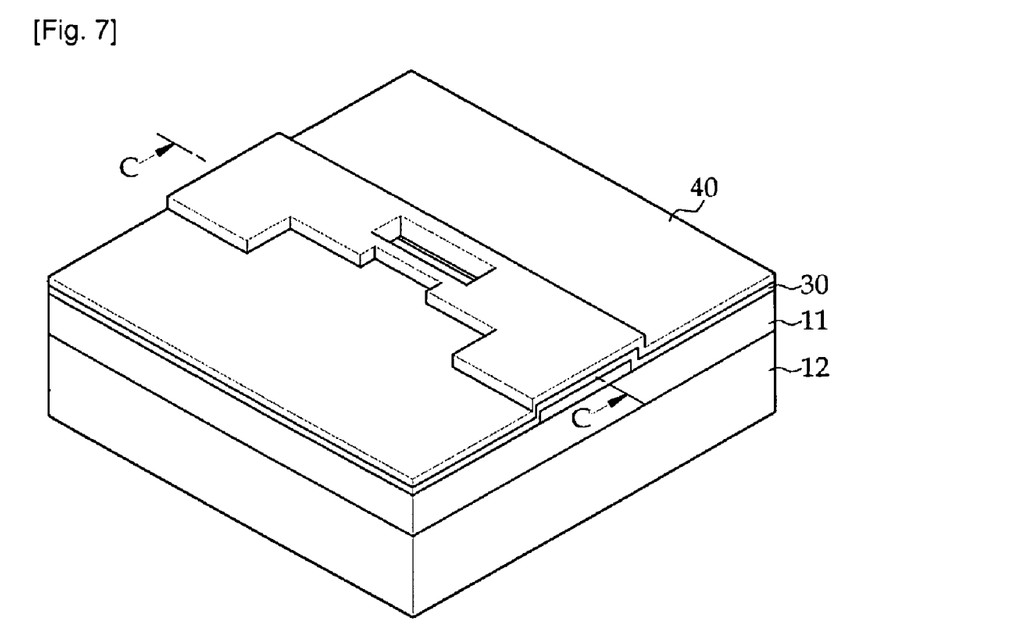
FIG. 7 is a perspective view illustrating a state where an oxide film is formed in a fabrication method of a room temperature-operating single-electron device according to a first embodiment of the present invention.
Figure 8:
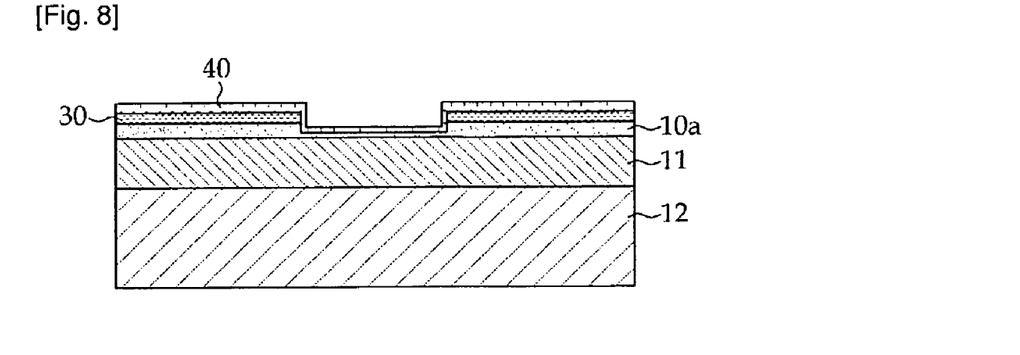
FIG. 8 is a cross-sectional view taken along the line C-C of FIG. 7.

A fifth step is a step where an oxide film 40 is deposited on the entire top surface of the SOI substrate. Silicide quantum dots 41 having a uniform size and high density can be formed through formation of the oxide film 40. The oxide film 40 is formed in such a fashion as to be left to stand in a hydrogen peroxide solution ($H_2O_2$) for about 10 minutes or in the air.

Figure 9:
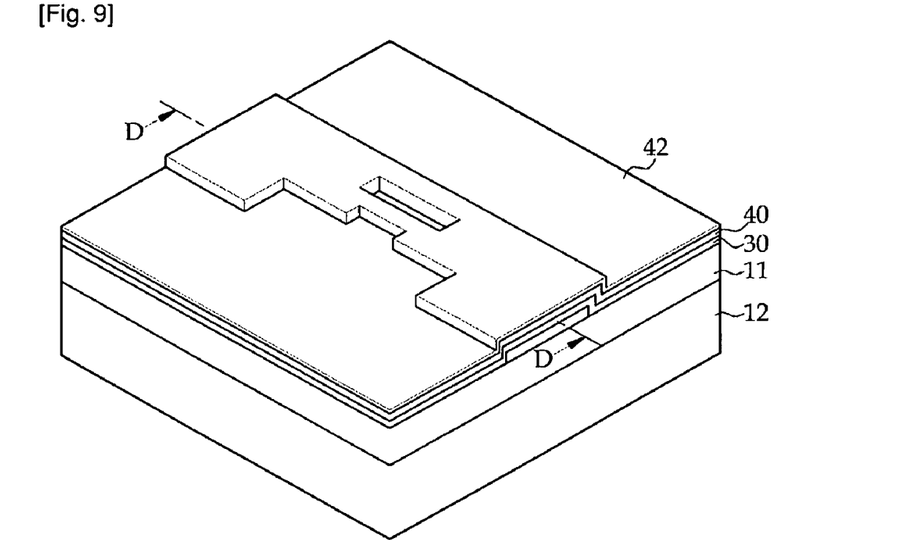
FIG. 9 is a perspective view illustrating a state where a metal film is formed in a fabrication method of a room temperature-operating single-electron device according to a first embodiment of the present invention.
Figure 10:
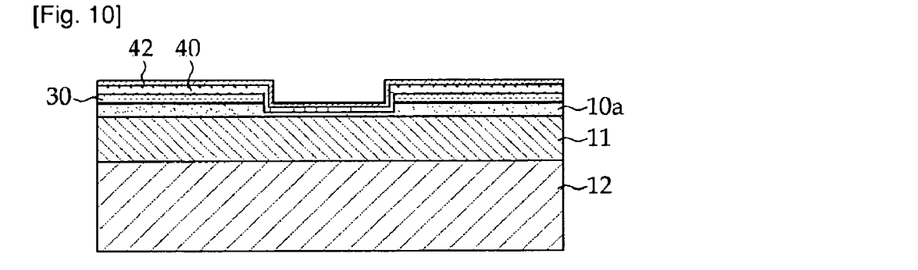
FIG. 10 is a cross-sectional view taken along the line D-D of FIG. 9.

A sixth step is a step where a metal film 42 is deposited on the entire top surface of the SOI substrate formed with the oxide film 40. The metal film 42 is deposited in order to silicidize the silicide trench 31 formed in the oxide film 40. In this case, as a material for the metal film 42, any metal may be used as long as it is silicidized with the silicon layer 10, but preferably is cobalt (Co). The deposition of the metal film 42 is conducted through a thermal treatment process. At this point, the meal film is deposited by means of electronic beam evaporator or molecular beam epitaxy (MBE) equipment in such a fashion that its thickness is within a range from 0.1 to 1 nm.

Figure 11:
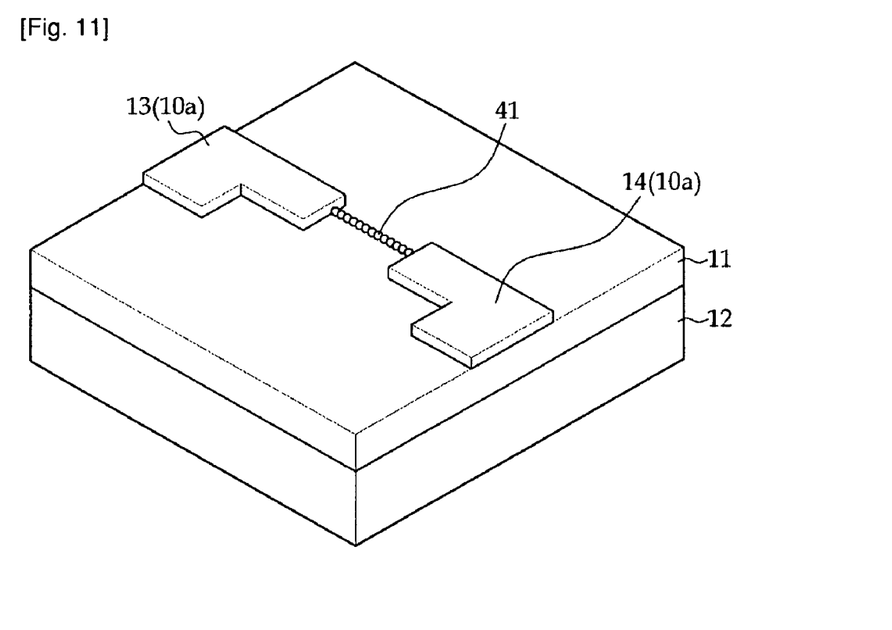
FIG. 11 is a perspective view illustrating a state where silicide quantum dots are formed by elimination of the metal film which is not silicidized and the silicon oxide film in a fabrication method of a room temperature-operating single-electron device according to a first embodiment of the present invention.

A seventh step is a step where silicide quantum dots 41 are formed. The metal film 42 is thermally treated through an electronic beam lithography process to achieve silicidization of the metal dots. In this case, the oxide film 40 is formed beneath the metal film 42. Referring to FIG. 8, the silicidization of the metal dots is conducted only at a portion where the metal film 42 and the active region 10a as the silicon layer 10 are in contact with each other, i.e., at a silicide trench 31. Since the silicon oxide film 30 is not coupled with the metal film 42, the metal film 42 at this portion is not silicidized. The metal film 42 which is not silicidized and the silicon oxide film 30 are removed to form quantum dots 41. The non-silicidized metal film 42 is removed by using a mixed solution of sulfuric acid and hydrogen peroxide solution, and the silicon oxide film 30 is removed by using buffered oxide etchant (BOE). FIG. 11 shows a state where silicide quantum dots 41 are formed between the source 13 and the drain 14.

Preferably, the silicide quantum dots 41 are formed in such a fashion that each metal dot has a diameter of 2 to 10 nm and approximately 1 to 50 metal dots are formed in a serial array. This is aimed at reducing the entire electric capacity of the single-electron device.

Figure 12:
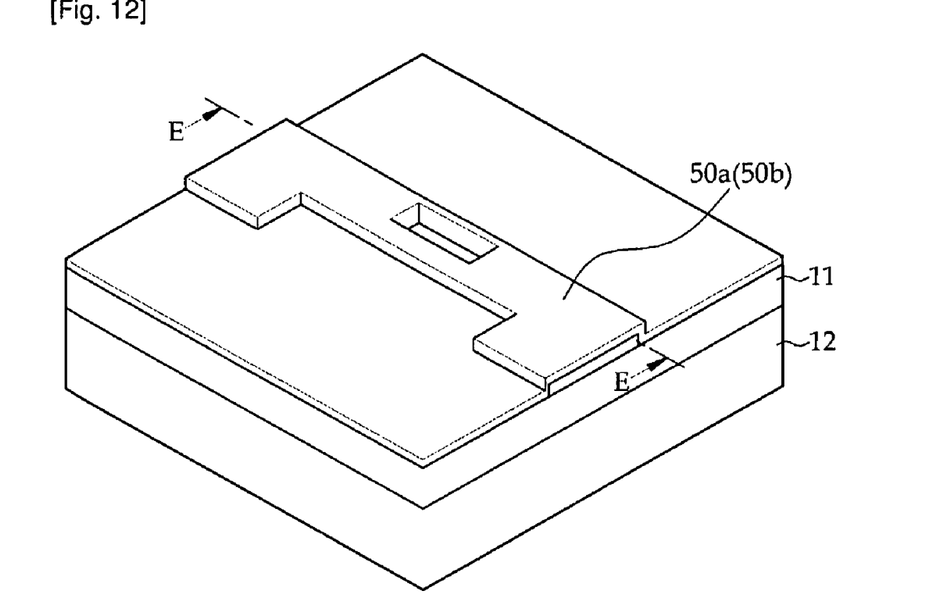
FIG. 12 is a perspective view illustrating a state where a gate oxide film is formed in a fabrication method of a room temperature-operating single-electron device according to a first embodiment of the present invention.

An eighth step is as a step where gate oxide films 50a and 50b are formed. As shown in FIG. 12, the gate oxide films 50a and 50b are deposited on the entire top surface of the SOI substrate. The gate oxide films 50a and 50b may be deposited using a chemical vapor depositor at low temperature. The gate oxide films 50a and 50b may be formed by varying thicknesses thereof in consideration of interference between the source 13, the drain 14 and the silicide quantum dots 41.

Figure 13:
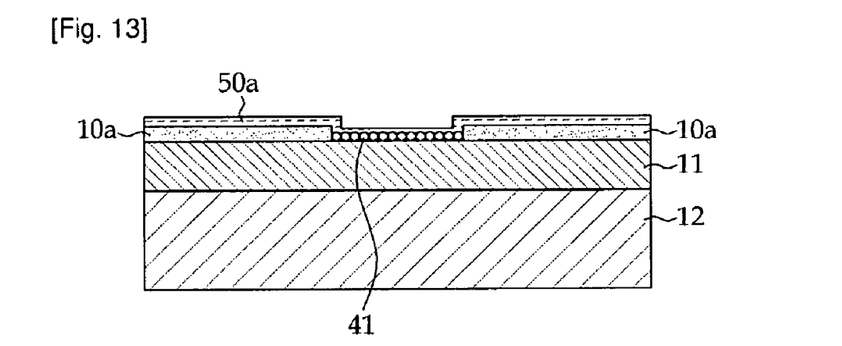
FIG. 13 is a cross-sectional view illustrating a state where a gate oxide film having a thickness of 30 to 50 nm is deposited to form a control gate in a fabrication method of a room temperature-operating single-electron device according to a first embodiment of the present invention, which is taken along the line E-E of FIG. 12.

In an example, as shown in FIG. 13, the gate oxide film 50a may be uniformly formed to a thickness of approximately 30 to 50 nm. This is aimed at avoiding any interference between the source 13, the drain 14 and the silicide quantum dots 41 by means of a control gate 62 which will be formed on the gate oxide film 50a.

Figure 14:
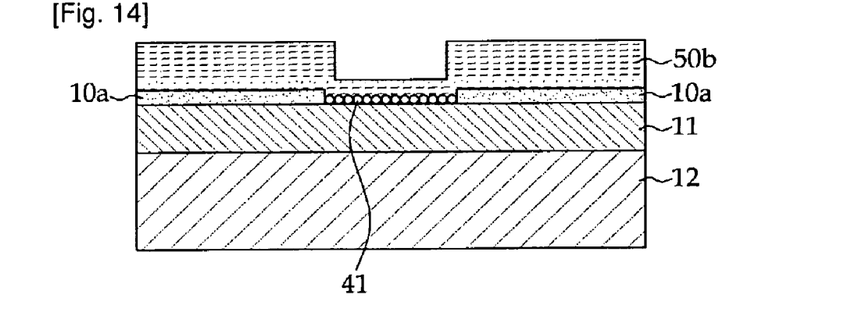
FIG. 14 is a cross-sectional view illustrating a state where a gate oxide film having a thickness of 100 to 300 nm is deposited to form a 'T'-shaped gate in a fabrication method of a room temperature-operating single-electron device according to a first embodiment of the present invention, which is taken along the line E-E of FIG. 12.

In another example, as shown in FIG. 14, the gate oxide film 50b is formed to a thickness of 100 to 300 nm, and particularly the gate oxide form 50b on the silicide trench 31 region may be formed to a thickness of approximately 30 to 50 nm using an electronic beam lithography method. This is aimed at minimizing deformation which may occur by the thermal treatment in the silicidization process.

Figure 15:
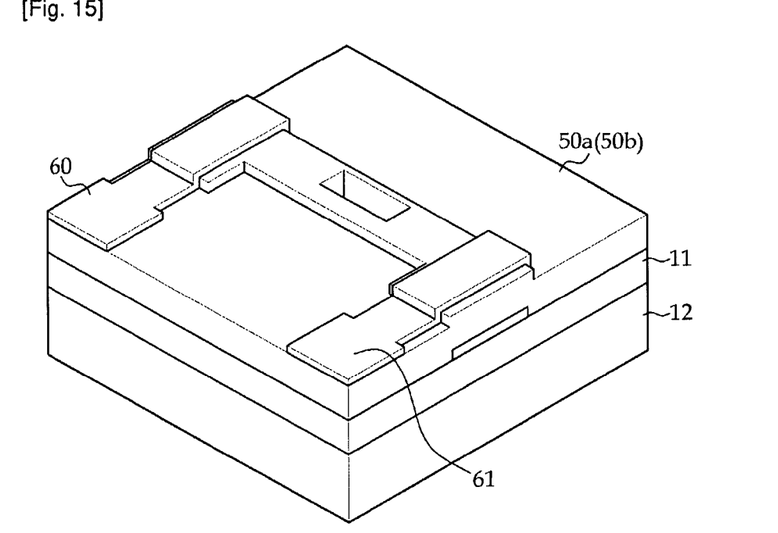
FIG. 15 is a perspective view illustrating a state where a source pad and a drain pad are formed in a fabrication method of a room temperature-operating single-electron device according to a first embodiment of the present invention.

A ninth step is a step where a source pad 60 and a drain pad 61 are formed. First, the gate oxide films 50a and 50b are etched by means of a photolithography method. In this case, first and second contact holes (not shown) are formed to externally expose the source 13 and the drain 14. Thereafter, the metal film 42 is deposited on the first and second contact holes so as to fill the first and second contact holes, and a photoresist is removed to form the source pad 60 and the drain pad 61. Since a method of removing the photoresist is well-known apparently within the scope of those skilled in the art, the detailed description thereof will be omitted.

Figure 16:
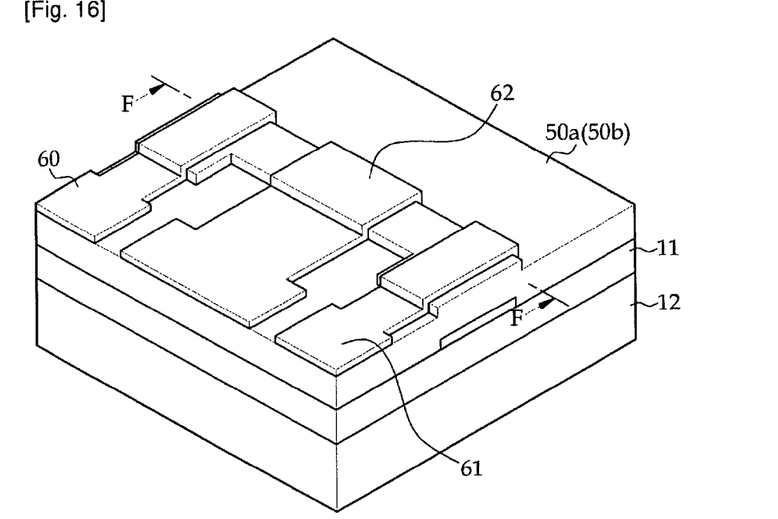
FIG. 16 is a perspective view illustrating a state where a gate is formed in a fabrication method of a room temperature-operating single-electron device according to a first embodiment of the present invention.

A tenth step is a step where a gate is formed. The gate is preferably formed to a thickness of 100 to 500 nm, and firmed as a control gate 62 or a T-shaped gate 63 depending on the gate oxide films 50a and 50b.

Figure 17:
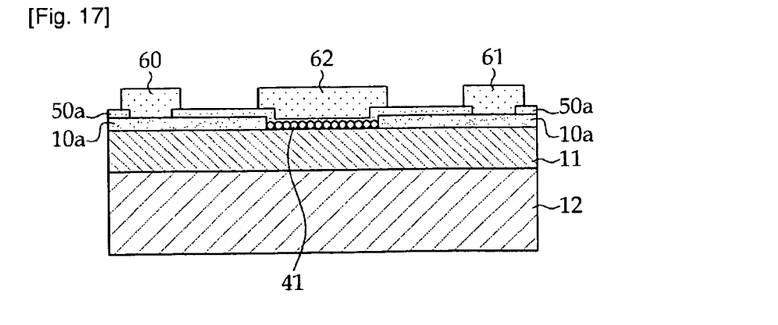
FIG. 17 is a cross-sectional view illustrating a state where a control gate is formed in a fabrication method of a room temperature-operating single-electron device according to a first embodiment of the present invention, which is taken along the line F-F of FIG. 16.
Figure 18:
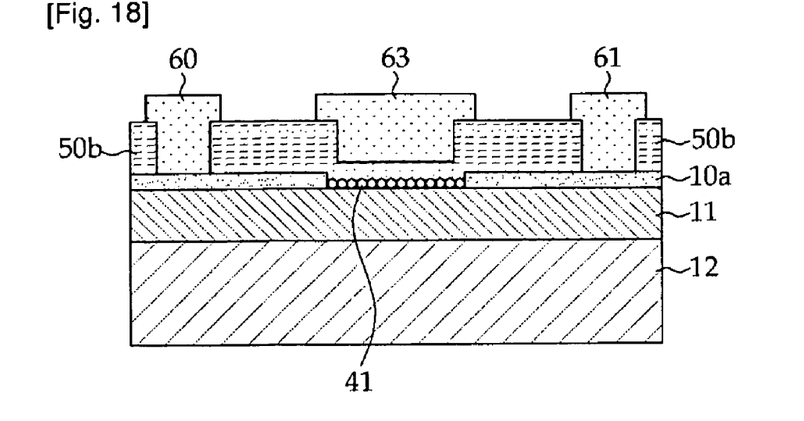
FIG. 18 is a cross-sectional view illustrating a state where a 'T'-shaped gate is formed in a fabrication method of a room temperature-operating single-electron device according to a first embodiment of the present invention, which is taken along the line F-F of FIG. 16.

A case of the control gate 62 will be described below.

A resist pattern is formed on the gate oxide films 50a and 50b on the metal silicide quantum dots 41 using electronic beam lithography or photolithography. Thereafter, as shown in FIG. 17, the metal film 42 is deposited to fill the top of the quantum dots 41, and then the resist pattern is removed to thereby form a control gate 62. The control gate 62 changes a potential energy of the metal silicide quantum dots 41 region and a partial region of the source 13 and the drain 14, and it is possible to easily fabricate the single-electron device.

A 'T'-shaped gate 63 is formed in the same manner as in the case where the control gate 62 is formed. The 'T'-shaped gate 63 is formed by a difference in thickness of the gate oxide films 50a and 50b as show in FIG. 18. The 'T'-shaped gate 63 is positioned above the metal silicide quantum dots 41 to change only a potential of the metal silicide quantum dots 41, and hence has an advantage of minimizing any interference between the quantum dots 41, the source 13 and the drain 14.

In a preferred embodiment of the present invention, although the case has been described in which the source pad 60 and the drain pad 61 are earlier formed and the gate is formed later, it is possible to earlier form the gate and to later form the source pad 60 and the drain pad 61.

Second Embodiment

Figure 21:
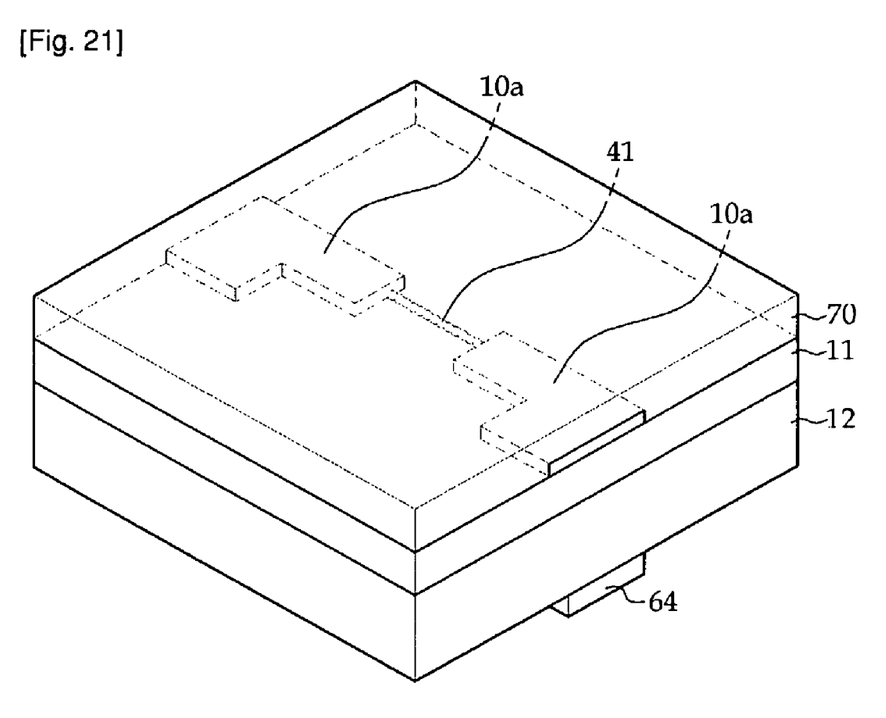
FIG. 21 is a perspective view illustrating a single-electron device fabricated by a fabrication method of a room temperature-operating single-electron device according to a second embodiment of the present invention.

FIG. 21 is a perspective view illustrating a single-electron device fabricated by a fabrication method of a room temperature-operating single-electron device according to a second embodiment of the present invention. Since the first to fourth steps in the overall steps of the fabrication method of a room temperature-operating single-electron device according to the second embodiment of the present invention are equal to those of the fabrication method of a room temperature-operating single-electron device according to the first embodiment of the present invention, the description thereof will be substituted by the aforementioned description of the second embodiment.

Figure 19:
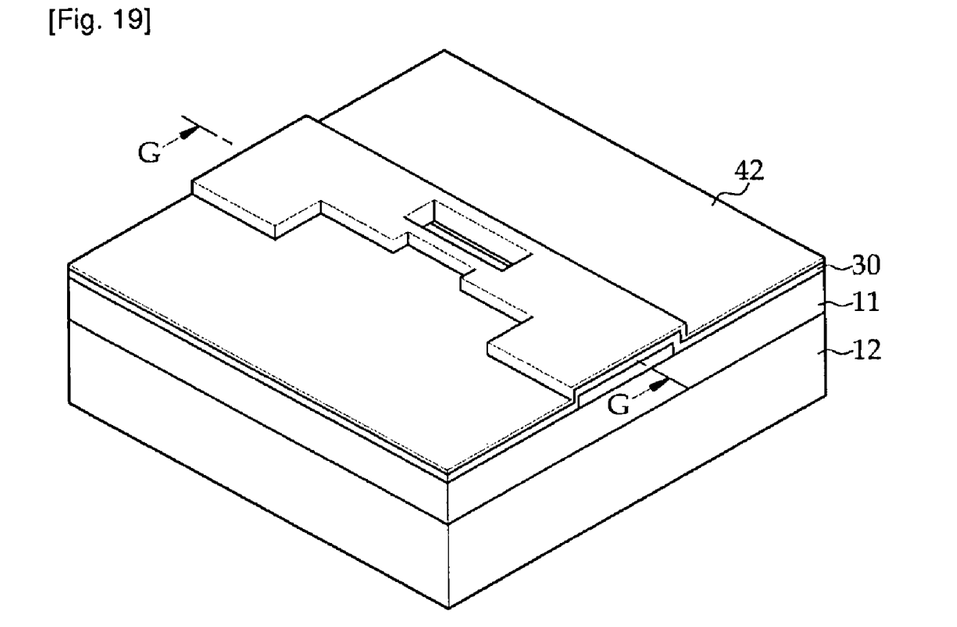
FIG. 19 a perspective view illustrating a state where a metal film is formed in a fabrication method of a room temperature-operating single-electron device according to a second embodiment of the present invention.

In a fifth embodiment of this embodiment, the metal film 42 is deposited on the entire top surface of the SOI substrate formed with the silicide trench 31 so as to be silicidized. In this case, as a material for the metal film 42, any metal may be used as long as it is silicidized with the silicon layer 10. In a preferred embodiment of the present invention, an example of the material for the metal film 42 may include cobalt (Co), erbium (Er), titanium (Ti) and the like, and nickel (Ni) may be used as the material for the metal film.

This metal film 42 is formed by means of a thermal treatment process. In this case, the metal film 42 is formed to a thickness of 0.1 to 1 nm by using an electronic beam evaporator or molecular beam epitaxy.

Figure 20:
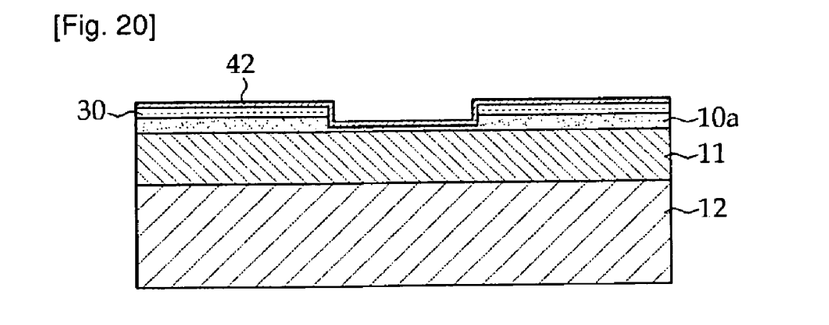
FIG. 20 is a cross-sectional view taken along the line G-G of FIG. 19.

The metal film 42 as formed above is thermally treated to achieve a silicidization of the metal dots. As shown in FIG. 20, the silicidization of the metal dots is conducted only at a portion where the metal film 42 and the active region 10a as the silicon layer 10 are in contact with each other, i.e., at a silicide trench 31. Since the silicon oxide film 30 is not coupled with the metal film 42, the remaining portion of the metal film 42 is not silicidized.

A sixth step is a step where silicide quantum dots 41 are formed. The silicon oxide film 30 and the metal film 42 which is not silicidized are removed to form quantum dots 41. A method of removing the silicon oxide film 30 and the non-silicidized metal film 42 is the same as that used in the first embodiment as described above.

A seventh step is a step where a protective film 70 is formed. The protective film 70 is aimed at protecting the active region 10a including the quantum dots 41, and is formed to a predetermined thickness above the silicon substrate 12. The protective film 70 corresponds to the gate oxide films 50a and 50b in the first embodiment.

An eighth step is a step where a source pad 60 and a drain pad 61 are formed. In this step, first and second contact holes are formed in the protective film 70 corresponds to the gate oxide films 50a and 50b. Then, the metal film is deposited on the first and second contact holes to form the source pad 60 and the drain pad 61.

Lastly, a ninth step is a step where a gate is formed. In this case, the gate is a bottom gate 64 which is formed to be positioned on the underside of the silicon substrate 12, preferably below the quantum dots. The bottom gate 64 serves to control the quantum dots, and can be fabricated without any additional process. Particularly, after the metal silicide quantum dots have been formed, when a thermal treatment is performed on the silicide quantum dots, a deformation may occur. For this reason, deformation can be avoided maximally. In this case, the bottom gate is fabricated to a thickness of 100 to 500 nm.

When a plurality of metal silicide quantum dots 41 is arrayed in series, the inventive single-electron device has relatively low electric capacity as compared to a conventional single-electron device defined by a single quantum dot, so that it can be operated at room temperature.

In the meantime, the present invention includes a room temperature-operating single-electron device fabricated by the aforementioned fabrication method.

INDUSTRIAL APPLICABILITY

While the invention has been described in connection with the aforementioned preferred embodiments, it is to be understood that various modifications or changes are possible without departing from the spirit and scope of the present invention. Therefore, the appended claims will include such modifications or changes falling within the spirit and scope of the present invention.

The invention claimed is:

1. A fabrication method of a room temperature-operating single-electron device, the method comprising the steps of:
    arming an SOI substrate by sequentially stacking an insulating layer 11 and a silicon layer 10 on a silicon substrate 12, and etching the silicon layer 10 of the SOI substrate to thereby form an active region 10a;
    forming a mask 20 on a central channel portion of the active region 10a, and injecting impurity ions into a part of the active region 10a to form a source region and a drain region;
    arming a silicon oxide film 30 on an entire top surface of the SOI substrate;
    etching a channel portion of the active region 10a to form a silicide trench 31;
    depositing an oxide film 40 on the entire top surface of the SOI substrate;
    depositing a metal film 42 on the entire top surface of the oxide film;
    thermally treating a part of the metal film 42 to achieve silicidization of the metal dots, and removing the silicon oxide film 30 and the metal film 42 which is not silicidized to form serially-arrayed silicide quantum dots 41;
    depositing gate oxide films 50a and 50b on the entire top surface of the SOI substrate;
    etching a part of the gate oxide films 50a and 50b positioned on the top of a source 13 and a drain 14 formed on both ends of the active region 10a to form each contact hole, and depositing a metal film to fill the contact hole to form a source pad 60 and a drain pad 61; and
    forming a resist pattern on the silicide trench 31 to form a gate.

2. The fabrication method according to claim 1, wherein the active region 10a has a length of 1 to 100 nm and a width of 10 to 15 nm.

3. The fabrication method according to claim 1, wherein the active region 10a is formed by means of photolithography, electronic beam lithography or reactive ion etching.

4. The fabrication method according to claim 1, wherein the silicon oxide film 30 has a thickness of 2 to 10 nm.

5. The fabrication method according to claim 1, wherein the silicon layer 10 has a thickness of 40 to 45 nm and a width of 6 to 10 nm.

6. The fabrication method according to claim 1, wherein the channel portion of the active region 10a is etched by means of reactive ion etching to have a thickness of 2 to 10 nm.

7. The fabrication method according to claim 1, wherein the oxide film 40 is formed in such a fashion as to be left to stand in a hydrogen peroxide solution ($H_2O_2$) or in the air.

8. The fabrication method according to claim 1, wherein the metal film 42 is made of cobalt.

9. The fabrication method according to claim 1, wherein the meal film 42 is deposited by means of electronic beam evaporator or molecular beam epitaxy (MBE) equipment in such a fashion that its thickness is within a range from 0.1 to 1 nm.

10. The fabrication method according to claim 1, wherein the metal film 42 is thermally treated through an electronic beam lithography process to form the silicide quantum dots 41.

11. The fabrication method according to claim 1, wherein the silicon oxide film 30 is removed by using a buffered oxide etchant (BOE) and the non-silicidized metal film 42 is removed by using a mixed solution of sulfuric acid and hydrogen peroxide solution.

12. The fabrication method according to claim 11, wherein each of the silicide quantum dots 41 has a diameter of 2 to 10 nm and the number of the silicide quantum dots is 1 to 50.

13. The fabrication method according to claim 1, wherein the gate oxide film is formed to a thickness of 30 to 50 nm by a chemical vapor deposition (CVD).

14. The fabrication method according to claim 1, wherein the gate oxide film has a thickness of 100 to 300 nm, and the gate oxide film on the silicide trench 31 is formed to a thickness of 30 to 50 nm by a chemical vapor deposition (CVD).

15. The fabrication method according to claim 2, wherein the gate is a control gate 62 or a 'T'-shaped gate 63.

16. The fabrication method according to claim 1, wherein the gate has a thickness of 100 to 500 nm.

17. A fabrication method of a room temperature-operating single-electron device, the method comprising:
    forming an SOI substrate by sequentially stacking an insulating layer 11 and a silicon layer 10 on a silicon substrate 12, and etching the silicon layer 10 of the SOI substrate to thereby form an active region 10*a*;

forming a mask 20 on a central channel portion of the active region 10*a*, and injecting impurity ions into the active region 10*a* to form a source region and a drain region;

forming a silicon oxide film 30 on a top surface of the SOI substrate;

etching a channel portion of the active region 10*a* by using the silicon oxide film 30 of the channel portion as a mask to form a silicide trench 31;

depositing a metal film 42 on the entire top surface of the SOI substrate and subjecting the metal film to silicidization;

removing the silicon oxide film 30 and the metal film 42 which is not silicidized to form serially-arrayed silicide quantum dots 41;

forming a protective film 70 on the entire top surface of the SOI substrate;

etching the protective film 70 positioned on the top of a source and a drain formed on both ends of the active region 10*a* to form each contact hole, and depositing a metal film to fill the contact hole to form a source pad 60 and a drain pad 61; and depositing a metal film on the underside of the SOI substrate to form a bottom gate.

\* \* \* \* \*